(12) United States Patent
Coleman (10) Patent No.: US 12,519,436 B2
(45) Date of Patent: Jan. 6, 2026

(54) REFERENTIAL AMPLIFIER DEVICES AND METHODS OF USE THEREOF

(71) Applicant: Intrinsix Corp., Marlborough, MA (US)

(72) Inventor: Edward Paul Coleman, Salt Springs, FL (US)

(73) Assignee: Cadence Design Systems, Inc., San Jose, CA (US)

(*) Notice: Subject to any disclaimer, the term of this patent is extended or adjusted under 35 U.S.C. 154(b) by 731 days.

(21) Appl. No.: 17/855,331

(22) Filed: Jun. 30, 2022

(65) Prior Publication Data

US 2024/0007066 A1 Jan. 4, 2024

(51) Int. Cl.
*H03F 3/45* (2006.01)
*H03F 1/30* (2006.01)
*H03G 3/30* (2006.01)

(52) U.S. Cl.
CPC ......... *H03F 3/45183* (2013.01); *H03F 1/301* (2013.01); *H03G 3/30* (2013.01)

(58) Field of Classification Search
CPC .. H03F 3/45183; H03F 1/301; H03F 3/45475; H03F 3/45188; H03G 3/30; G05F 3/30
USPC ....................................................... 330/253
See application file for complete search history.

(56) References Cited

U.S. PATENT DOCUMENTS

| | | | | |
|---|---|---|---|---|
| 5,926,062 A | * | 7/1999 | Kuroda | G05F 3/265 327/513 |
| 2014/0070873 A1 | * | 3/2014 | Gunther | G05F 3/30 327/512 |

* cited by examiner

Primary Examiner — Andrea Lindgren Baltzell
Assistant Examiner — Khiem D Nguyen
(74) Attorney, Agent, or Firm — Mark H. Whittenberger; Holland & Knight LLP (57) ABSTRACT

A referential amplifier device includes an input port configured to be electrically coupled to a source to receive an input signal from the source at an input voltage level. A first current path system is coupled to the input port and comprises a first transconductor device, a third transconductor device, a first resistor device, and a second resistor device. A second current path system is in parallel with the first current path system and comprises a second transconductor device and a fourth transconductor device. A current level in the second transconductor device is set equal to a current level in the first transconductor device, and a current level in the second transconductor device is set equal to a current level in the fourth transconductor device. An output port is coupled to the second current path system and configured to provide an output voltage based on a difference between the input voltage level and a threshold voltage level for the referential amplifier device. A method of making the referential amplifier device is also disclosed.

14 Claims, 11 Drawing Sheets

(Prior Art)

REFERENTIAL AMPLIFIER DEVICES AND METHODS OF USE THEREOF

FIELD

The present technology relates to a referential amplifier device for use in integrated circuit devices and methods of use thereof.

BACKGROUND

Many implantable energy harvesting and internet of things (IoT) applications require fundamental building blocks, such as bandgaps, amplifiers, and comparators. These elements must be designed for low power consumption and small die area. However, low power analog circuitry often requires significant die area due to the very large resistors that are needed to generate the bias and feedback voltages needed in many analog circuits. This is often overcome by using complex systems composed of smaller high current elements that are operated at a low on-time duty cycle together with sample and hold circuitry to reduce the average current draw.

Figure 1:
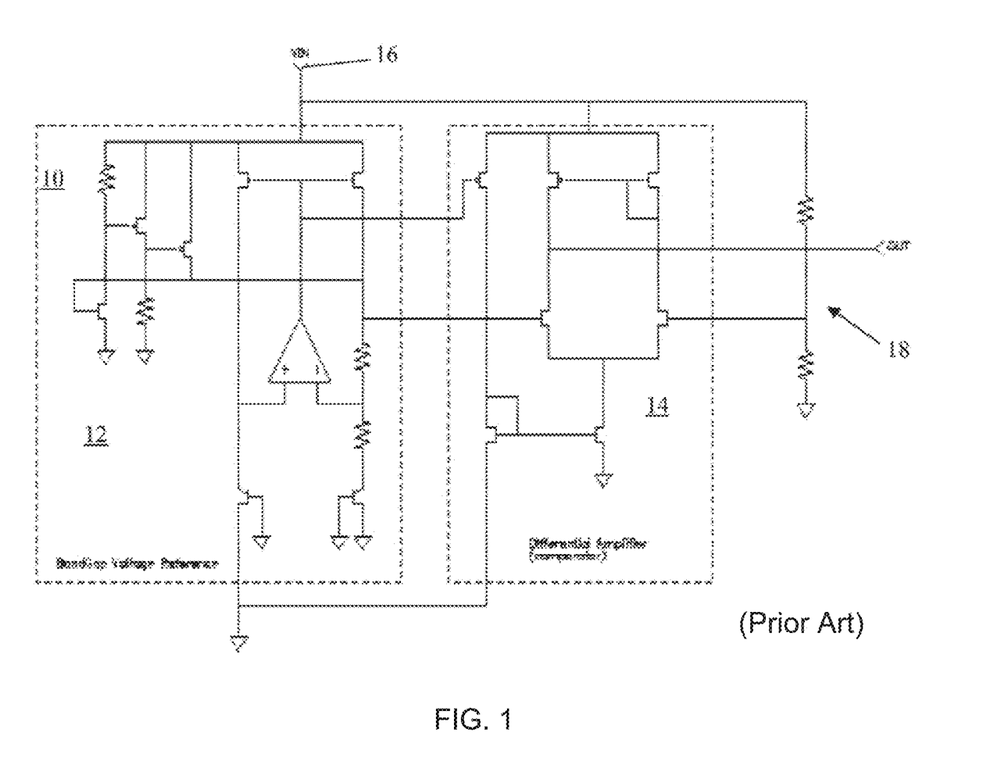
FIG. 1 is a circuit diagram of a prior art referential amplifier circuit.

For example, FIG. 1 illustrates a prior art referential amplifier device 10. The referential amplifier device 10 in this example includes a bandgap voltage reference 12 that is coupled to a differential amplifier (gm stage) 14 or comparator. The bandgap voltage reference 12 is compared to an input voltage (VIN) 16 via a resistor feedback divider 18 and provides an output. The referential amplifier device 10 has a number of disadvantages when employed in low power systems.

First, the referential amplifier device 10 requires a high current level for operation. The approach illustrated in FIG. 1 requires 6 series current paths to support the bandgap reference 12, the differential amplifier 14, and the resistor feedback divider 18. Second, the referential amplifier device 10 shown in FIG. 1 consumes a large die area. In particular, the die area is made large by the need to employ larger resistors in the bandgap reference 12 and the resistor feedback divider 18, as the physical size of an integrated resistor (based on resistance employed) is inversely proportional to the power dissipated in the resistor as given by the following equation.

$$P = V^2/R \quad (1)$$

where P is the power dissipated, V is the voltage, and R is the resistance. Third, the bandgap reference 12 requires a start-up circuit, which requires additional current and larger resistors. The bandgap reference 12 has two stable states of operation ($V_{BG}=0$ and $V_{BG}=\sim1.2V$). However, the $V_{BG}=0$ state must be avoided which requires employing the additional current and large resistors, which increases die area.

SUMMARY

A referential amplifier device includes an input port configured to be electrically coupled to a source to receive an input signal from the source at an input voltage level. A first current path system is coupled to the input port and comprises a first transconductor device, a third transconductor device, a first resistor device, and a second resistor device. A second current path system is in parallel with the first current path system and comprises a second transconductor device and a fourth transconductor device. A current level in the second transconductor device is set equal to a current level in the first transconductor device, and a current level in the second transconductor device is set equal to a current level in the fourth transconductor device. An output port is coupled to the second current path system and configured to provide an output voltage based on a difference between the input voltage level and a threshold voltage level for the referential amplifier device.

A method of making a referential amplifier device includes providing an input port configured to be electrically coupled to a source to receive an input signal from the source at an input voltage level. A first current path system comprising a first transconductor device, a third transconductor device, a first resistor device, and a second resistor device is coupled to the input port. A second current path system is provided in parallel with the first current path system and comprises a second transconductor device and a fourth transconductor device. A current level in the second transconductor device is set equal to a current level in the first transconductor device, and a current level in the second transconductor device is set equal to a current level in the fourth transconductor device. An output port is coupled to the second current path system and configured to provide an output voltage based on a difference between the input voltage level and a threshold voltage level for the referential amplifier device.

The disclosed referential amplifier circuit advantageously provides a low current building block that may be used as a bandgap reference, differential amplifier, or comparator. In differential amplifier and comparator mode a bandgap is advantageously not needed. The referential amplifier circuit achieves an adjustable reference voltage at bandgap level accuracies without explicitly including a bandgap voltage reference. The disclosed approach reduces the required current and die area by combining amplifier, comparator, and bandgap principals to provide an ultra-low power, low-area solution. Examples of the present technology further eliminate the need for a start-up circuit. The disclosed referential amplifier circuit may be employed, by way of example only, in battery chargers, in low power energy harvesting applications, IoT devices, and medical implant integrated circuits.

DETAILED DESCRIPTION

Figure 2A:
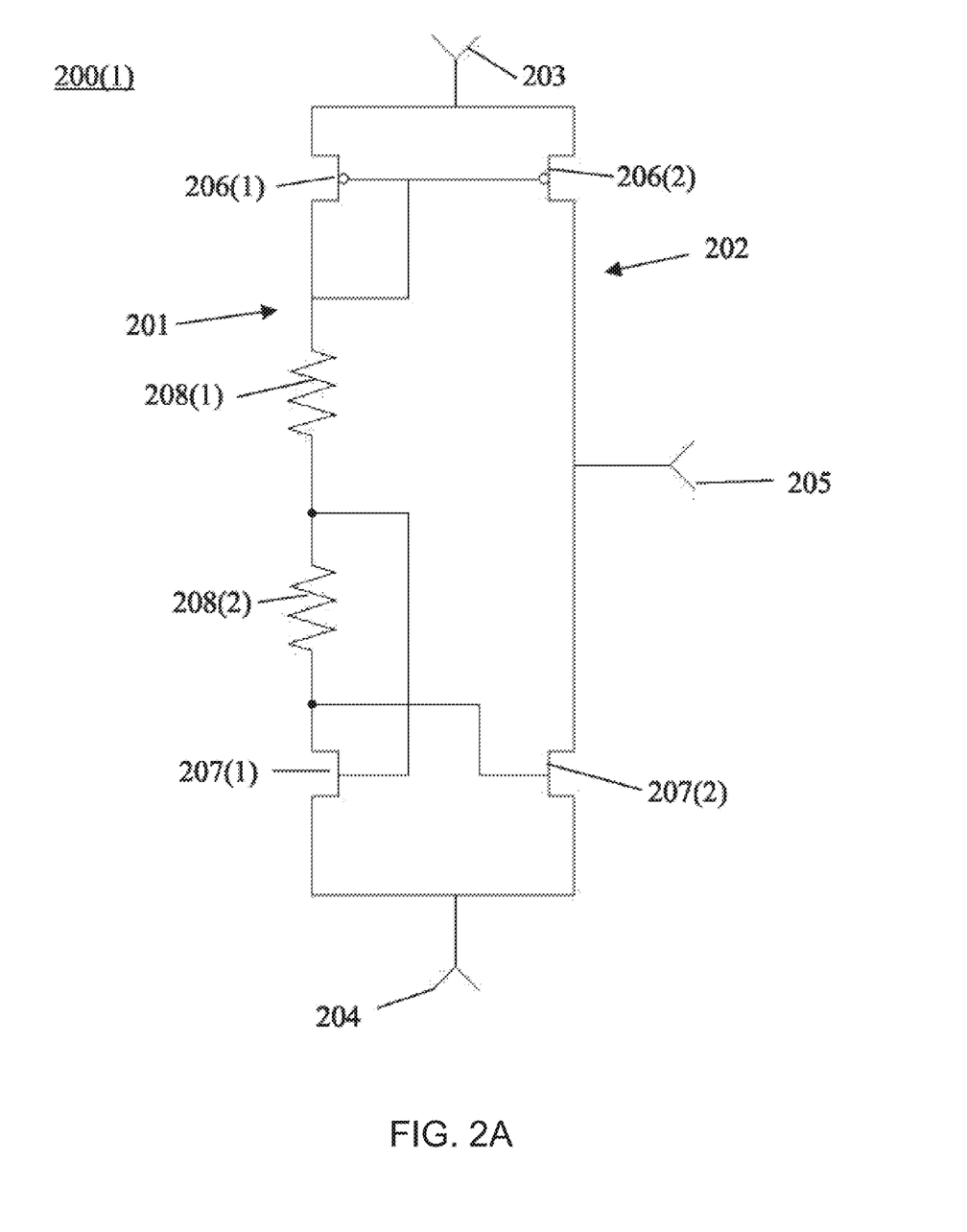
FIG. 2A is a circuit diagram of an exemplary referential amplifier device of the present technology.

An example of a referential amplifier device 200(1) is illustrated in FIG. 2A. In this particular example, the referential amplifier device 100 includes two parallel current path systems 201 and 202, input port 203, a ground 204, an output port 205, first and second transconductor devices 206(1) and 206(2), third and fourth transconductor devices 207(1) and 207(2), and resistor devices 208(1) and 208(2), although the referential amplifier device 200(1) may include other types and/or numbers of elements or components in other configurations, such as the additional components of referential amplifier device 200(2) illustrated and described with respect to FIG. 2B below, which provides a high gain version of the present technology. Referring again to FIG. 2A, in this example a more simplified low gain version of a referential amplifier device 200(1), is employed.

The present technology provides a number of advantages including providing a low current referential amplifier device that requires only two current paths for operation. Examples of this technology do not require a bandgap reference or a feedback voltage divider for operation, which both require larger resistance elements, which allows for a smaller die area for the referential amplifier device. Further, the removal of the bandgap reference eliminates the requirement for a start-up circuit, which reduces the current level and reduces the required die area. The referential amplifier device 200(1) of the present technology may be employed in a number of applications as described in further detail below.

Referring again to FIG. 2A, the referential amplifier device 200(1) includes two parallel current path systems comprising a first current path system 201 and a second current path system 202 that provide an output that responds to the difference between the input voltage level for the referential amplifier device 200(1) and an intrinsic voltage reference (or threshold voltage) inherent to the circuit bias topology of the referential amplifier device 200(1), as described in further detail below.

Input port 203 is configured to be coupled to a source that provides current to operate the circuit of the referential amplifier device 200(1). Input port 203 is coupled to both the first and second current path systems 201 and 202, which are in parallel. In one example, the current required to operate the circuit is approximately 200 nA, although other operational current levels may be employed depending on the operation. The input port 203 also provides a voltage level ($V_{IN}$) at the input port 203 that is employed for differential signal measurements as described in further detail below. The ground 204 is coupled to both of the parallel current path systems 201 and 202 and provides a ground return for the circuit of the referential amplifier device 200(1).

The output port 205 is provided along the second current path system 202 and provides an output current ($I_{OUT}$) and output voltage ($V_{OUT}$) for the referential amplifier device 200(1) as described in further detail below. The output current ($I_{OUT}$) and output voltage ($V_{OUT}$) are responsive to the difference between the input voltage ($V_{IN}$) provided to the input port 203 and the intrinsic reference (threshold) voltage ($V_{REF}$) of the referential amplifier device 200(1).

In this example, the referential amplifier device 200(1) includes first and second transconductor devices 206(1) and 206(2), which are located along the first and second current path systems 201 and 202, respectively. The referential amplifier device 200(1) also includes third and fourth transconductor devices 207(1) and 207(2), which are located along the first and second current path systems 201 and 202, respectively, although other numbers of transconductor devices may be employed, such as in the referential amplifier device 200(2) illustrated in FIG. 2B and discussed in further detail below. In this example, the transconductor devices 206(1), 206(2), 207(1), and 207(2) are configured to perform voltage-to-current conversion and may employ any type of FET. In this example, transconductor devices 206(1) and 206(2) and 207(1) and 207(2) are selected from transistor devices that can be utilized to tune the threshold reference voltage ($V_{REF}$) of the referential amplifier device 200(1). By way of example, transconductor devices 206(1) and 206(2) and 207(1) and 207(2) can be selected from core, high voltage, low voltage, high threshold, low threshold, etc. transistor devices in order to tune the reference (threshold) voltage ($V_{REF}$) of the referential amplifier device 200(1). In this example, transconductor devices 206(1) and 206(2) are negative gain transconductor devices, while transconductor devices 207(1) and 207(2) are positive gain transconductor devices.

The referential amplifier device 200(1) in this example also includes resistor devices 208(1) and 208(2) located along the first current path system 201, although other numbers of resistors may be employed. The value of the resistors 208(1) and 208(2) are selected such that the sum of the complimentary to absolute temperature terms (CTAT) terms of the referential amplifier device 200(2) equals the sum of the proportional to absolute temperature (PTAT) terms, which results in the threshold ($V_{REF}$) or trip point of the referential amplifier device 200(1) being independent of temperature. Further, the resistors 208(1) and 208(2) in this example provide the total resistance in the first current path system 201 (bias leg) and are set to a prescribed total resistance to eliminate the temperature variation in the threshold ($V_{REF}$) for regulation, or in a comparator application, the trip point of the comparator. The voltage drop across the resistor 208(2) provides the gate drive for the third transconductor device 207(1), which is lower than the gate drive to the fourth transconductor device 207(2), and the gate drive difference is equal to the voltage drop across the resistor 208(2), as described in further detail below.

Figure 2B:
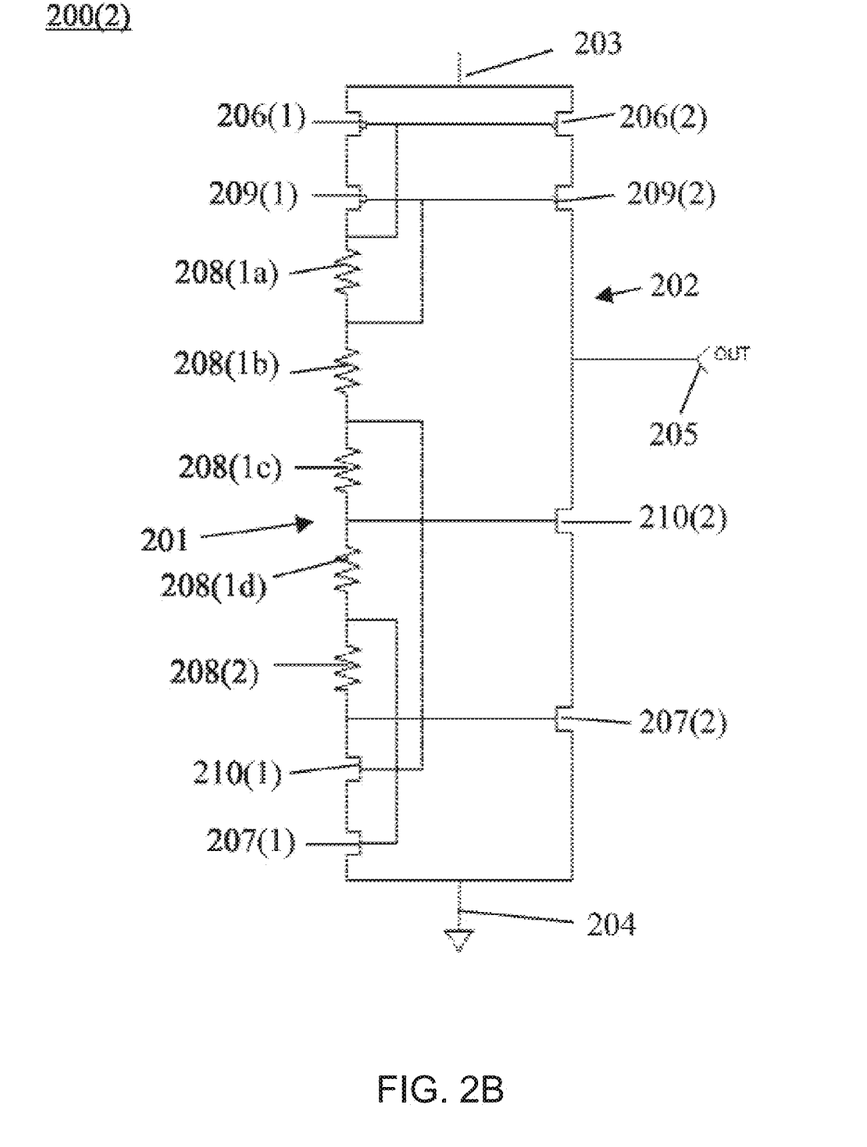
FIG. 2B is a circuit diagram of an exemplary high gain referential amplifier device of the present technology.

Referring now to FIG. 2B, another exemplary referential amplifier device 200(2) is illustrated. This example provides a high gain version of the present technology. The referential amplifier device 200(2) is similar in structure and operation to the referential amplifier device 200(1) except as described below. Referring again to FIG. 2B, in this example the referential amplifier device 200(2) also includes the first current path system 201 and the second current path system 202 in parallel that provide an output that responds to the difference between the input voltage level for the referential amplifier device 200(2) and an intrinsic voltage (threshold) reference inherent to the circuit bias topology of the referential amplifier device 200(2).

Input port 203 is configured to be coupled to a source that provides current to operate the circuit of the referential amplifier device 200(2). Input port 203 is coupled to both the first and second current path systems 201 and 202. In one example, the current required to operate the circuit is approximately 200 nA, although other operational current levels may be employed. The input port 203 also provides a voltage level ($V_{IN}$) at the input port 203 that is employed for differential signal measurements as described in further detail below. The ground 204 is coupled to both of the parallel first and second current paths 201 and 202 and provides a ground return for the circuit of the referential amplifier device 200(2).

The output port 205 is provided along the second current path system 202 and provides an output current ($I_{OUT}$) and output voltage ($V_{OUT}$) for the referential amplifier device 200(2) as described in further detail below. The output current ($I_{OUT}$) and output voltage ($V_{OUT}$) are responsive to the difference between the input voltage ($V_{IN}$) provided to the input port 203 and the intrinsic reference (threshold) voltage ($V_{REF}$) of the referential amplifier device 200(2).

In this example, the referential amplifier device 200(1) includes first and second transconductor devices 206(1) and 206(2), which are located along the first and second current path systems 201 and 202, respectively. The referential amplifier device 200(1) also includes third and fourth transconductor devices 207(1) and 207(2), which are located along the first and second current path systems 201 and 202, respectively, although other numbers of transconductor devices may be employed, such as in the referential amplifier device 200(2) illustrated in FIG. 2B and discussed in further detail below. In this example, the transconductor devices 206(1), 206(2), 207(1), and 207(2) are configured to perform voltage-to-current conversion and may be employ any type of FET. In this example, transconductor devices 206(1) and 206(2) and 207(1) and 207(2) are selected from transistor devices that can be utilized to tune the threshold reference voltage ($V_{REF}$) of the referential amplifier device 200(1). By way of example, transconductor devices 206(1) and 206(2) and 207(1) and 207(2) can be selected from core, high voltage, low voltage, high threshold, low threshold, etc. transistor devices in order to tune the reference (threshold) voltage ($V_{REF}$) of the referential amplifier device 200(1). In this example, transconductor devices 206(1) and 206(2) are negative gain transconductor devices, while transconductor devices 207(1) and 207(2) are positive gain transconductor devices.

In this example, the gain at the output port 205 is increased by employing the first and third cascode devices 209(1) and 209(2) and the second and fourth cascode devices 210(1) and 210(2). In this example, cascode devices 209(1) and 210(2) are cascoded diode tied devices that have their drain-source voltage drops complimentary to absolute temperature (CTAT). Cascode devices 209(1) and 209(2) and cascode devices 210(1) and 210(2) are selected from transistor devices that can be utilized to tune the threshold reference voltage ($V_{REF}$) of the referential amplifier device 200(2). By way of example, cascode devices 209(1) and 2089(2) and cascode devices 210(1) and 210(2) can be selected from core, high voltage, low voltage, high threshold, low threshold, etc. transistor devices in order to tune the reference (threshold) voltage ($V_{REF}$) of the referential amplifier device 200(2). In this example, cascode devices 209(1) and 210(1) are cascoded diode tied devices that have their drain-source voltage drops complimentary to absolute temperature (CTAT).

In this example, the resistor 208(1) is provided in segment 208(1a)-208(1d), although other numbers of resistors may be employed. In this example, the segmented resistors 208(1a)-208(1d), as well as the resistor 208(2) are located along the first current path system 201. The values of the resistors 208(1a)-208(1d) and 208(2) are selected such that the sum of the complimentary to absolute temperature terms (CTAT) terms of the referential amplifier device 200(2) equals the sum of the proportional to absolute temperature (PTAT) terms, which results in the threshold ($V_{REF}$) or trip point of the referential amplifier device 200(2) being independent of temperature. The resistors 208(1a)-208(1d) add to the series resistance in the first current path system 201 to provide a gate bias voltage bias for the cascode devices 209(1), 209(2), 210(1), and 210(2) to provide a high gain implementation of the referential amplifier device 200(2). The area is not increased by adding the segmented resistors 208(1a)-208(1d) because the total resistance in the first current path system 201 (bias leg) is set to a prescribed total resistance to eliminate the temperature variation in the threshold ($V_{REF}$) for regulation, or in a comparator application, the trip point of the comparator. The voltage drop across the resistor 208(2) provides the gate drive for the cascode device 210(1), which is lower than the gate drive to the cascode device 210(2), and the gate drive difference is equal to the voltage drop across the resistor 208(2), as described in further detail below.

An exemplary operation of the referential amplifier device 200(1) of the present technology will now be described with reference to FIG. 2A. The operation of the referential amplifier device 200(2) is similar but is configured to operate in a high gain mode, as described above.

Referring again to FIG. 2A, the referential amplifier device 200(1) receives an input voltage ($V_{IN}$) from a source coupled to the input port 203. The source is selected based on the application of the referential amplifier device 200(1), such as the exemplary applications described below. $V_{IN}$ provides current to operate the circuit. In one example, $V_{IN}$ is approximately 200 nA and provides the voltage level for differential signal measurements, as described in further detail below.

The referential amplifier device 200(1) provides an output current ($I_{OUT}$) and output voltage $V_{OUT}$ for the referential amplifier device 200(1) through the output port 205. The values for $I_{OUT}$ is defined by the following equation:

$$I_{OUT}=gm*(V_{IN}-V_{REF}) \quad (2)$$

where gm is the voltage to current gain of the referential amplifier device 200(1), $V_{IN}$ is the voltage provided to the input port 203, and $V_{REF}$ is the intrinsic bandgap voltage reference (threshold) of the referential amplifier device 200(1). The value for the threshold reference voltage ($V_{REF}$) of the referential amplifier device 200(1) can be tuned based on the selection of the transconductor devices 206(1) and 206(2) and 207(1) and 207(2). By way of example, transconductor devices 206(1) and 206(2) and 207(1) and 207(2) can be selected from core, high voltage, low voltage, high threshold, low threshold, etc. transistor devices in order to tune the reference (threshold) voltage ($V_{REF}$) of the referential amplifier device 200(1). The voltage ($V_{OUT}$) is defined by the following equation:

$$V_{OUT}=gm*(V_{IN}-V_{REF})*R_{OUT} \quad (3)$$

where gm is the voltage to current gain of the referential amplifier device 200(1), $V_{IN}$ is the voltage provided to the input port 203, $V_{REF}$ is the intrinsic bandgap voltage reference of the referential amplifier device 200(1), and $R_{OUT}$ is the output impedance of the referential amplifier device 200(1). Thus, the referential amplifier 200(1) provides an output $V_{OUT}$ that is dependent on the difference between the input voltage ($V_{IN}$) and the threshold voltage ($V_{REF}$) similar to a bandgap reference. However, the referential amplifier device 200(1) does not require an explicit bandgap reference circuit, which reduces the complexity, current, and die area required for the providing the voltage output ($V_{OUT}$).

Referring now to FIG. 2B, in this example, the gain at the output port 205 is enhanced by including cascode devices 209(1), 209(2), 210(1), and 210(2), as illustrated in FIG. 2B.

The gate bias voltage for the cascode devices is generated by segmenting the resistor 208(1) into resistors 208(1a)-208(1d) such that the series resistance in the bias leg 201 of the referential amplifier device 200(2). The area is not increased by adding the segmented resistors 208(1a)-208(1d) because the total resistance in the first current path system 201 (bias leg) is set to a prescribed total resistance to eliminate the temperature variation in the threshold for regulation, or in the case of a comparator application (as described in further detail below), the trip point of the comparator.

Referring again to FIG. 2A, the output at the output port 205 is at the circuit trip point when the current in the third transconductor 206(2), which is set equal to the current in the first transconductor device 206(1) by the PMOS weak inversion current mirror, equals the current in the fourth transconductor device 207(2).

As the input voltage ($V_{IN}$) from the input port 203 increases from below the threshold ($V_{REF}$) of the referential amplifier device 200(1), the output is low, and when input voltage ($V_{IN}$) exceeds the threshold voltage ($V_{REF}$) of the referential amplifier device 200(1), the output provided at the output port 205 transitions from a low state to a high state (0 to $V_{IN}$). As the input voltage ($V_{IN}$) voltage level increases the current in the second current path system 202 of the referential amplifier device 200(1) increases, and as the current level increases, the voltage drop across the resistor 208(2) increases. The voltage drop across the resistor 208(2) provides the gate drive for the cascode device 110(1), which is lower than the gate drive to the third transconductor device 207(1)), and the gate drive difference is equal to the voltage drop across the resistor 208(2).

In this example, the transconductor devices 207(1) and 207(2) are operated in weak inversion, which emulates the operation of a bipolar transistor. The area of the transconductor device 207(2) is x times larger than the area of the cascode transconductor device 207(1), and at the threshold ($V_{REF}$) of the referential amplifier device 200(1), when the current through the transconductor devices 207(2) and 207(1) are equal, the current density of the transconductor device 207(1) is x times greater than the current densify of the transconductor device 207(2).

There is an input voltage ($V_{IN}$) level provided to the input port 203 where the voltage drop across the resistor 208(1) will result in the current in the transconductor device 108(1) being equal to the current in the transconductor device 108(2). This occurs when:

$$V\_R6(T) = n * (k*T/q) * \ln((W/L)\_MN4/(W/L)\_MN2) \qquad (4)$$

where n is the weak inversion slope factor (~1.4).

The voltage drop across the resistor 208(2) is proportional to current, which means that the current levels in both the first and second current path systems 201 and 202 of the referential amplifier device 200(1) at the threshold level are proportional to absolute temperature (PTAT). In this example, the cascode devices 206(1) and 206(2) are cascoded diode tied devices, and their drain-source voltage drops are complimentary to absolute temperature (CTAT). Since the current level at threshold is proportional to absolute temperature (PTAT), the temperature coefficient of the threshold level can be minimized by selecting the appropriate resistance in the first current path system 201 based on the values of the resistors 208(1) an d208(2), such that the sum of the CTAT terms equals the sum of the PTAT terms, which results in the threshold or trip point of the referential amplifier device 200(1) being independent of temperature.

A number of exemplary operations of the referential amplifier device 200(1) will now be described with respect to FIGS. 3-8, respectively. Although the examples are described with respect to referential amplifier 200(1) it is to be understood that the high gain referential amplifier 200(2) could be employed.

Figure 3:
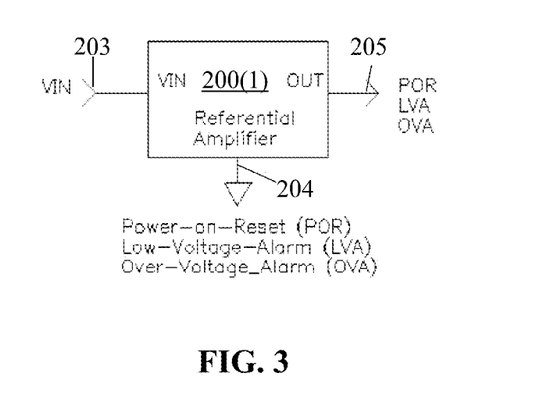
FIG. 3 illustrates one exemplary application of the referential amplifier device of the present technology in a power management system.

Referring now to FIG. 3, in one example referential amplifier device 200(1) can be employed in a comparator mode. Operating in comparator mode, the referential amplifier device 200(1) is employed for detecting when the input voltage ($V_{IN}$) exceeds or descends below the threshold voltage ($V_{REF}$). The referential amplifier device 200(1) can be utilized in this mode for example in power management systems that require power on reset (POR) for reliable operation when powering up digital electronics. Referential amplifier device 200(1) can further be used to determine under voltage and over voltage situations in such systems. Under voltage levels must also be detected with low voltage alarm (LVA) to disable circuitry when supply levels are too low for reliable operation. Also, over voltage alarm (OVA) is required to protect electronics from voltage stress or unreliable operation when the supply voltage exceeds the voltage rating of the devices that comprise the circuitry in the application.

Figure 4:
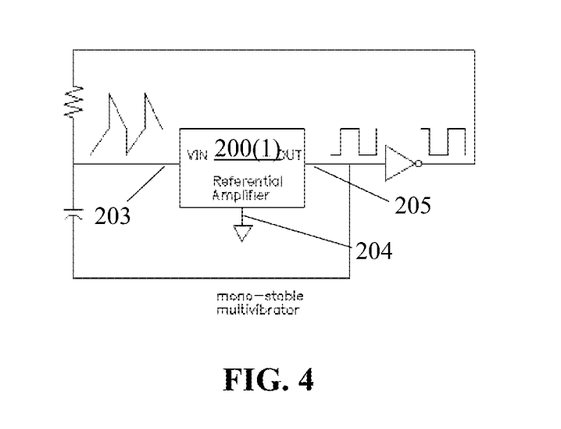
FIG. 4 illustrates another exemplary application of the referential amplifier device of the present technology in a mono-stable multivibrator.

Referring now to FIG. 4, the referential amplifier device 200(1) can be used to create a temperature independent voltage threshold for a mono-stable multivibrator circuit as illustrated in FIG. 4. The mono-stable multivibrator circuit can be used to generate free running clocks, by way of example only, which can be used by digital circuitry to sequence state machines. In this example, the RC network and the threshold voltage ($V_{REF}$) of the referential amplifier device 200(1) set the frequency of the clock output as illustrated in FIG. 4.

Figure 5:
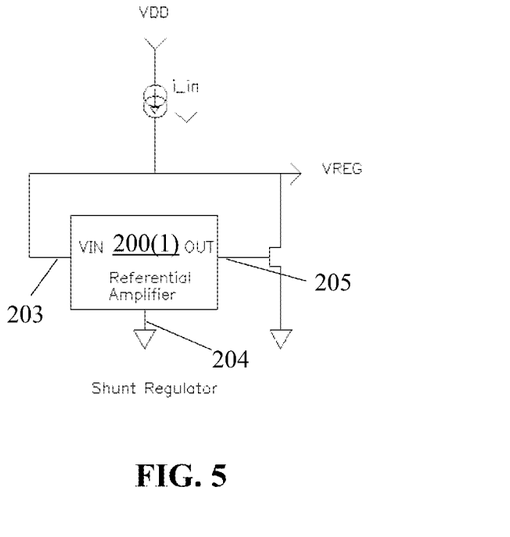
FIG. 5 illustrates yet another exemplary application of the referential amplifier device of the present technology in a shunt regulator.

Referring now to FIG. 5, in another example, the referential amplifier device 200(1) can be employed in a shunt regulator for an energy harvesting system. Shunt regulators are often needed in energy harvesting systems where the harvested power level may exceed the power required by the application. When a capacitor or battery on the VREG node of the shunt regulator, as illustrated in FIG. 5, reaches the maximum allowable state of charge, excess receive energy must be dissipated. In this case the referential amplifier device 200(1) can be operated in a linear mode to drive the gate of an NMOS shunt regulator to dissipate excess energy, limiting VREG to a voltage that is no higher than the threshold voltage ($V_{REF}$) of the referential amplifier device 200(1).

Figure 6:
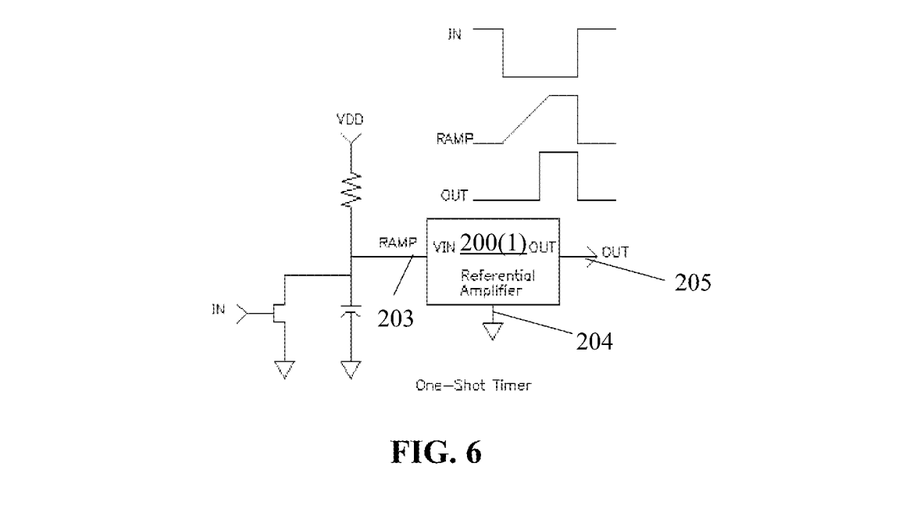
FIG. 6 illustrates a further exemplary application of the referential amplifier device of the present technology in a delay timer.

Referring now to FIG. 6, in a further example the referential amplifier device 200(1) can act as a delay path in comparator mode. In this example, the referential amplifier device 200(1) is used to detect when the RAMP signal exceeds the referential amplifier threshold level voltage ($V_{REF}$). The RC ramp charges up when IN is released (set to logic low). The RC time constant sets the rate of charge for the capacitor, which in turn determines a delay from IN going low, and OUT going high. Delay timers are used to enable circuitry once a set time delay has expired, allowing time for a circuit to reach a stable operating point.

Figure 7:
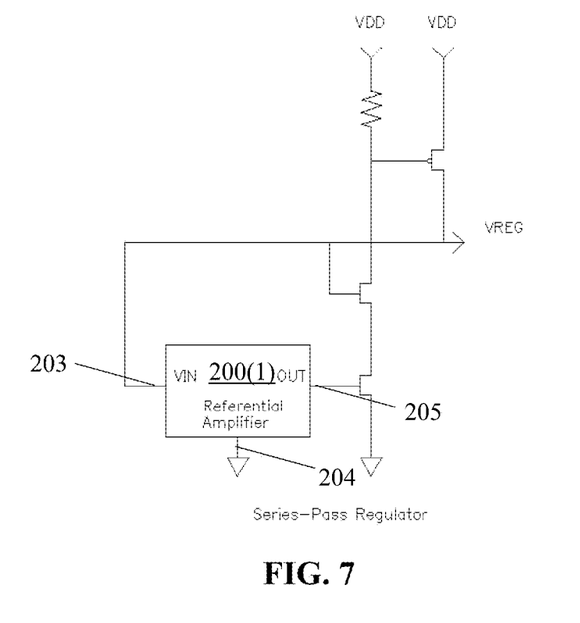
FIG. 7 illustrates another exemplary application of the referential amplifier device of the present technology in a series-pass regulator.

Referring now to FIG. 7, in this example the referential amplifier device 200(1) can be used to create a temperature independent supply voltage that draws power from a supply that is greater than the threshold voltage ($V_{REF}$) of the referential amplifier device 200(1). This topology is commonly called a series-pass regulator. In many energy harvesting applications, the analog circuitry requires a higher voltage supply than the digital circuitry. The digital circuitry will often draw power from the output of a series-pass regulator in order to lower the supply voltage to a safe operating voltage for the digital electronics.

Figure 8:
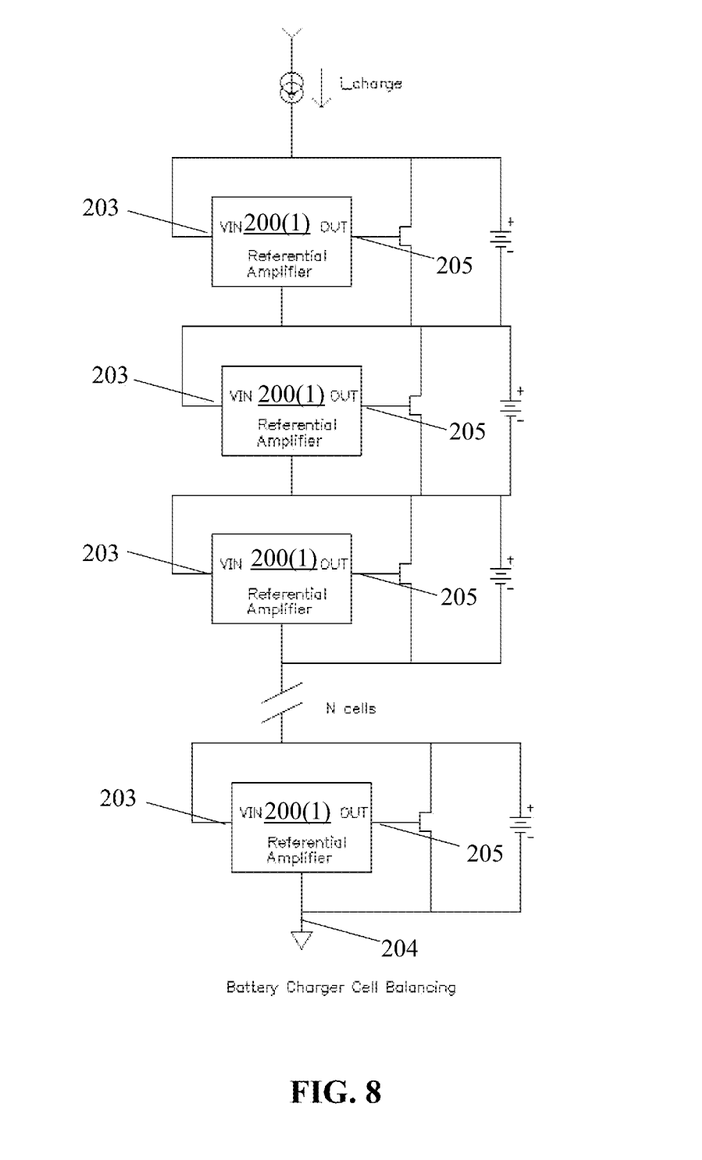
FIG. 8 illustrates yet another exemplary application of the referential amplifier device of the present technology in a battery charger.
Figure 9:
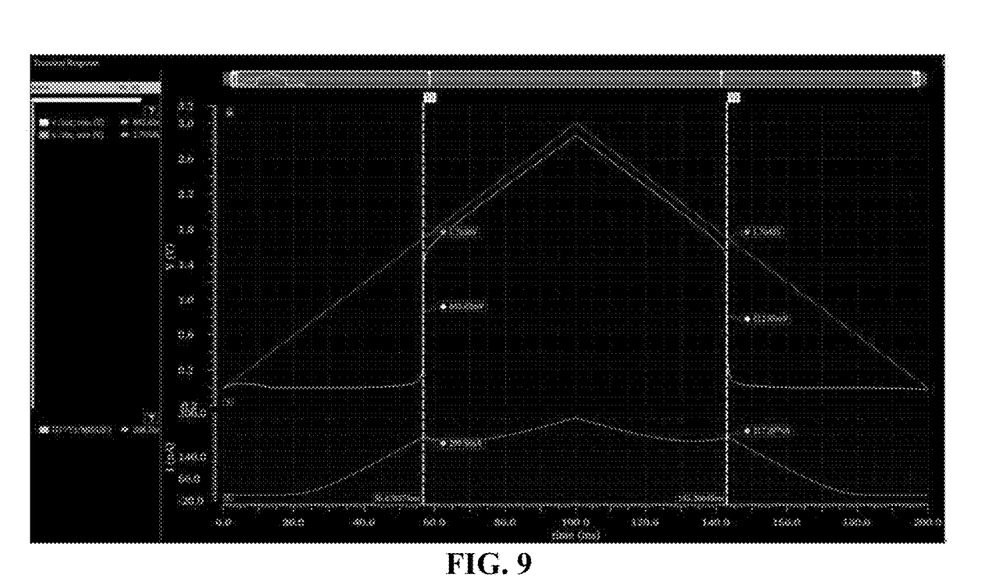
FIGS. 9-16 illustrate exemplary test bench date for a referential amplifier device of the present technology.
Figure 10:
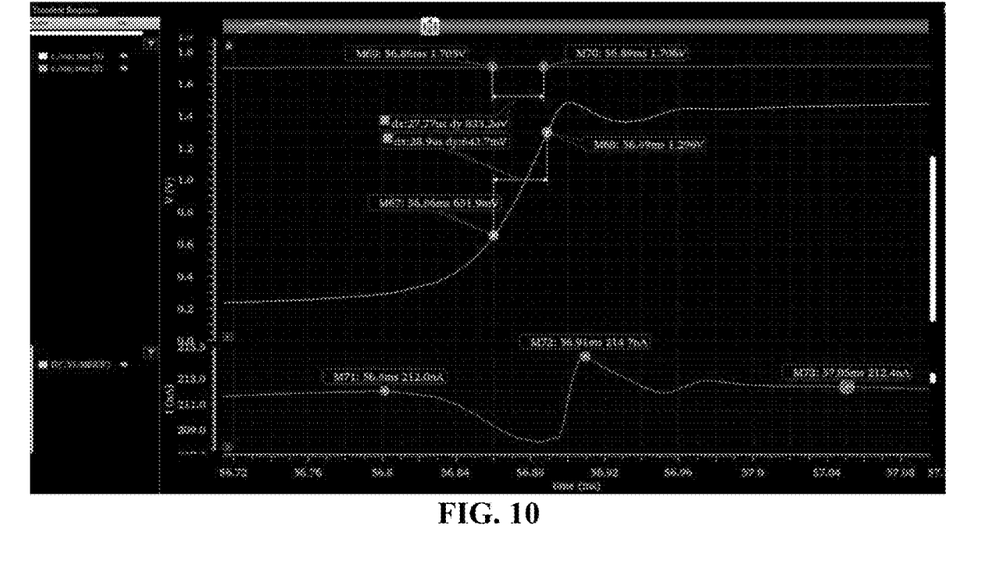
Figure 11:
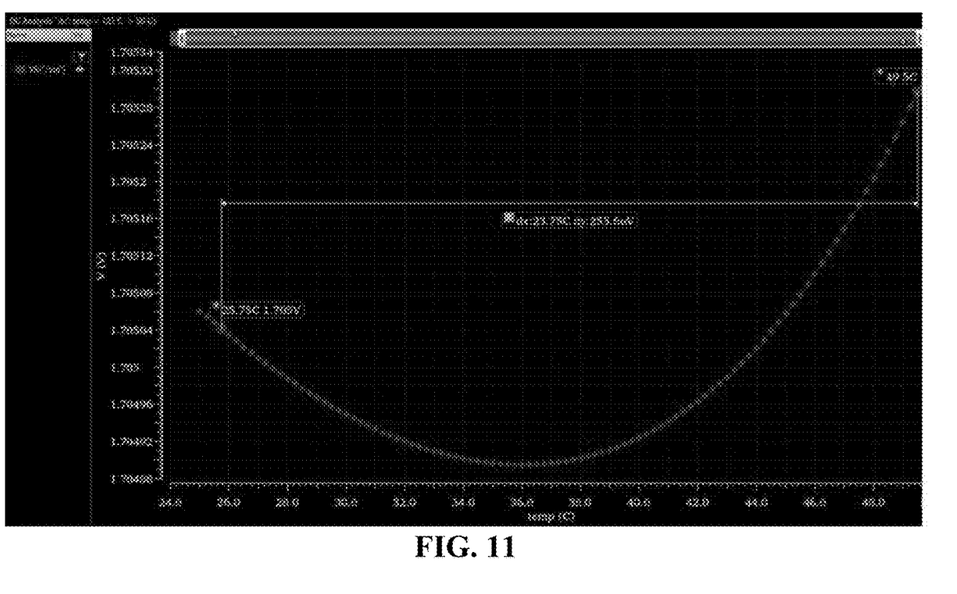
Figure 12:
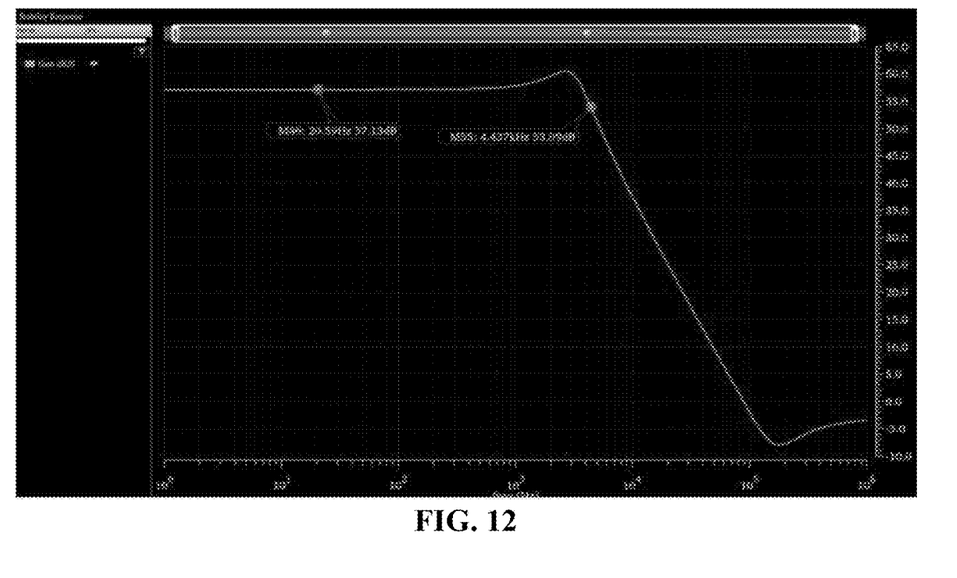
Figure 13:
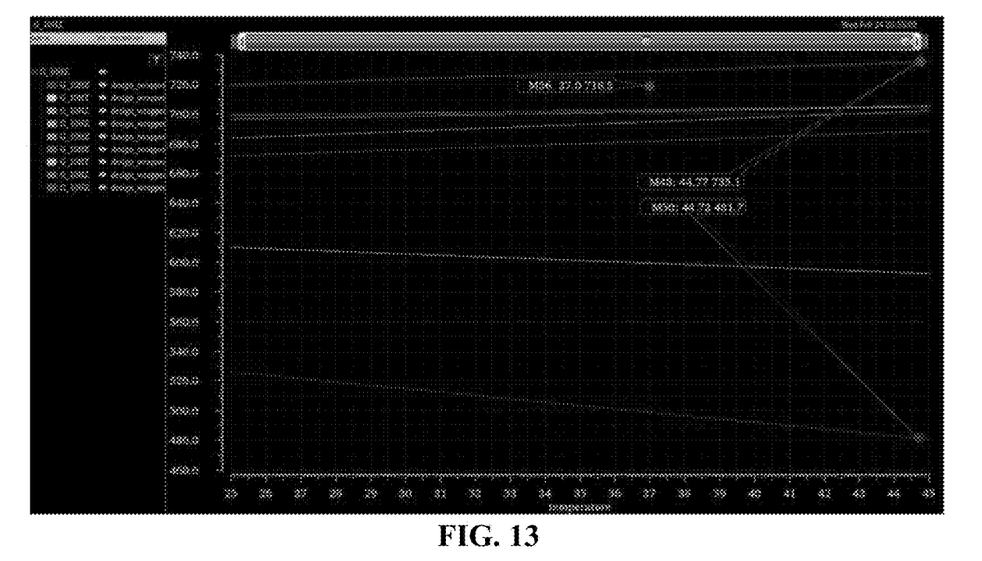
Figure 14:
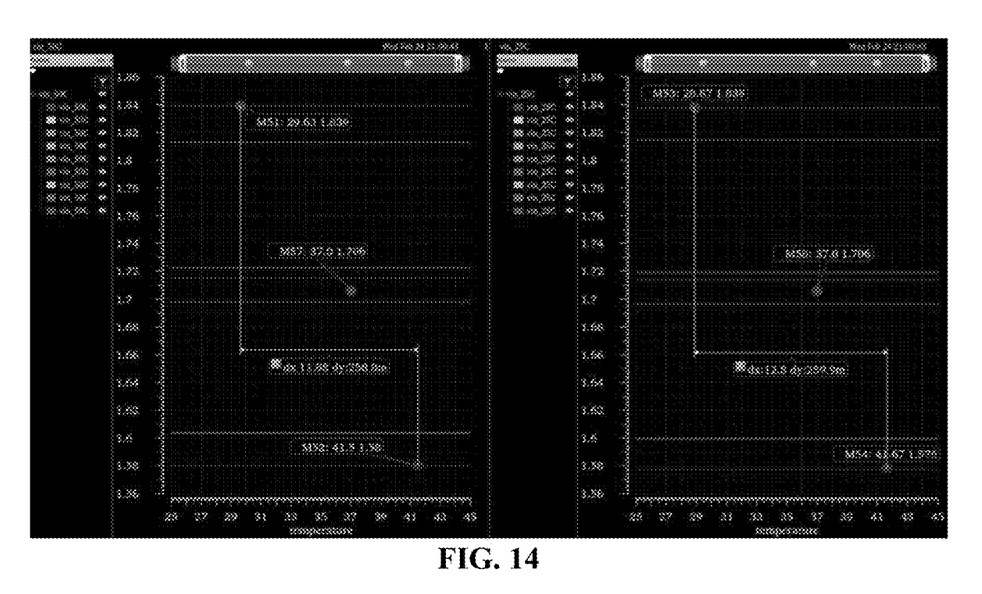
Figure 15:
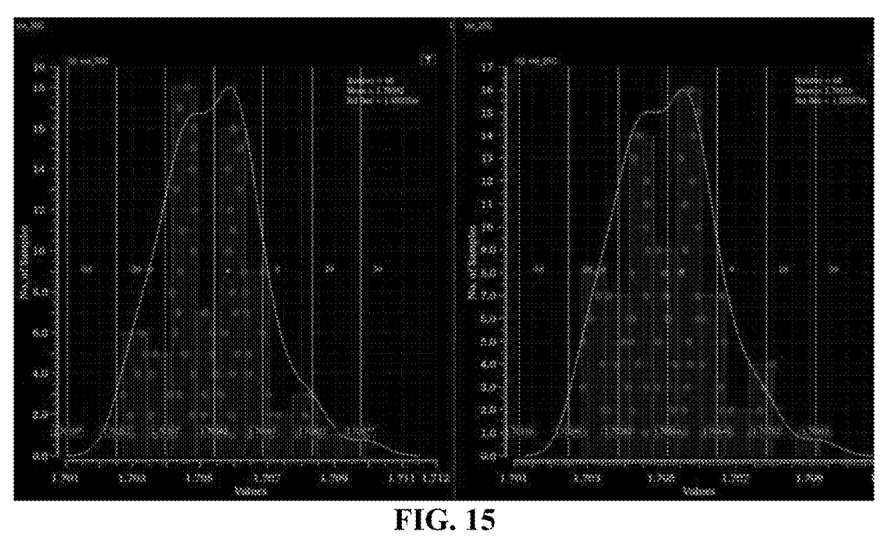
Figure 16:
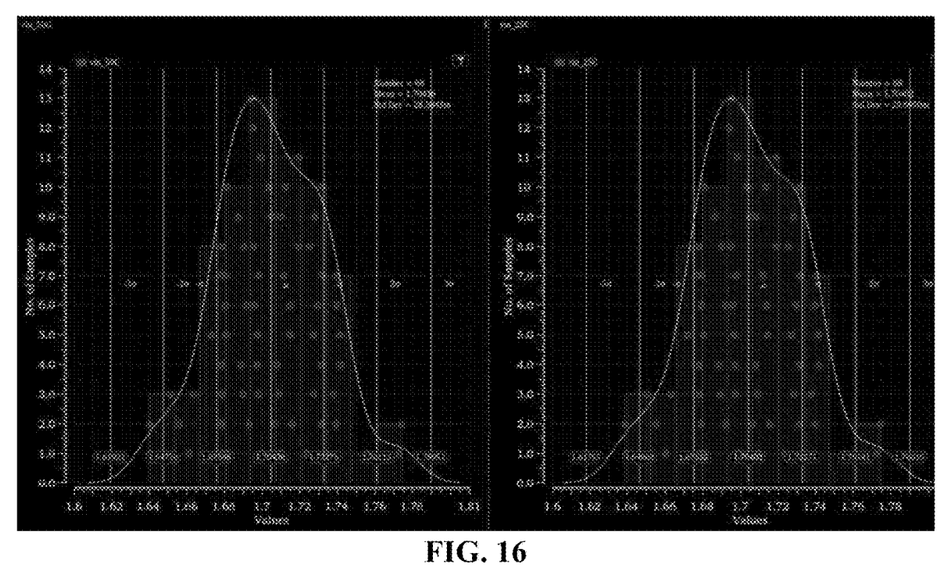

Referring now to FIG. 8, operating in linear mode, the referential amplifier device 200(1) of the present technology can be combined with a shunt transistor in a stacked configuration to prevent charge imbalance when charging series stacked batteries, as shown in FIG. 8. Cell balance during battery charging is commonly found in high voltage applications, such as the batteries used to power motor vehicles, or energy storage in solar or wind farm applications.

Although several exemplary applications are illustrated and described, it is to be understood that the referential amplifier device 200(1) or the high gain referential amplifier device 200(2) of the present technology could be employed in numerous other applications to provide an output voltage that responds to differences between the input voltage and the threshold voltage of the circuit.

Examples

FIGS. 9-16 illustrate exemplary test bench data for a referential amplifier device of examples of the present technology.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A referential amplifier device comprising:
   an input port configured to be electrically coupled to a source to
      receive an input signal from the source at an input voltage level;
   a first current path system coupled to the input port and comprising a first transconductor device,
   a third transconductor device, a first resistor device, and a second resistor device;
   a second current path system in parallel with the first current path
      system and comprising a second transconductor device and a fourth transconductor device, wherein a current level in the second transconductor device is set equal to a current level in the first transconductor device, and a current level in the second transconductor device is set equal to a current level in the fourth transconductor device;
   an output port coupled to the second current path system and configured to provide an output voltage based on a difference between the input voltage level and a threshold voltage level for the referential amplifier device;
   wherein the first current path system further includes a first cascade device and a third cascade device and the second current path system further comprises a second cascade device and a fourth cascade device; and
   wherein the first resistor includes a plurality of resistor segments configured provide a gate bias voltage for the first, second, third, and fourth cascade devices.

2. The referential amplifier device of claim 1, wherein the first current path system is configured to have a resistance value that eliminates temperature variation in the threshold voltage level.

3. The referential amplifier device of claim 1, wherein the first transconductor device and the third transconductor device are configured to have voltage drops that are complimentary to absolute temperature.

4. The referential amplifier device of claim 1, wherein the first current path system and the second current path system are configured at the threshold voltage level to have current levels that are proportional to absolute temperature.

5. The referential amplifier device of claim 1, wherein the second transconductor device and the fourth transconductor device are configured to set the output port at the threshold voltage level when a current level in the second transconductor device equals a current level in the fourth transconductor device.

6. The referential amplifier device of claim 1, wherein the third transconductor device and the fourth transconductor device are configured to be operated in weak inversion.

7. The referential amplifier device of claim 1, wherein the first, second, third, and fourth cascade devices and the plurality of resistor segments increase the voltage gain level at the output port.

8. A method of making a referential amplifier device, the method comprising:
   providing an input port configured to be electrically coupled to a source to receive an input signal from the source at an input voltage level;
   coupling a first current path system comprising a first transconductor device, a third transconductor device, a first resistor device and a second resistor device to in the input port;
   providing a second current path system comprising a second transconductor device and fourth transconductor device in parallel to the first current path system, wherein a current level in the second transconductor device is set equal to a current level in the first transconductor device, and a current level in the second transconductor device is set equal to a current level in the fourth transconductor device;
   coupling an output port to the second current path system, the output port configured to provide an output voltage based on a difference between the input voltage level and a threshold voltage level for the referential amplifier device;
   providing a first cascade device and a third cascade device located along the first current path system;
   providing a second cascade device and a fourth cascade device located along the second current path system; and
   wherein the first resistor includes a plurality of resistor segments configured provide a gate bias voltage for the first, second, third, and fourth cascade devices.

9. The method claim 8, wherein a resistance value in the first current path system is set to eliminate temperature variation in the threshold voltage of the referential amplifier device.

10. The method of claim 8, wherein the first transconductor device and the third transconductor device have voltage drops that are complimentary to absolute temperature.

11. The method of claim 8, wherein current levels in the first current path system and the second current path system at the threshold voltage are proportional to absolute temperature.

12. The method of claim 8, wherein the referential device is at the threshold voltage when a current level in the second transconductor device equals a current level in the fourth transconductor device.

13. The method of claim 8, wherein the third transconductor device and the fourth transconductor device are configured to be operated in weak inversion.

14. The method of claim 8, wherein the first, second, third, and fourth cascade devices and the plurality of resistor segments increase the voltage gain level at the output port.

* * * * *